(12) United States Patent
Liu et al.

(10) Patent No.: US 12,470,054 B2
(45) Date of Patent: Nov. 11, 2025

(54) WIRE CONNECTION PROTECTION DEVICE

(71) Applicant: SHENZHEN CHENBEI TECHNOLOGY CO., LTD., Shenzhen (CN)

(72) Inventors: Lei Liu, Shenzhen (CN); JiaJian Chen, Shenzhen (CN); XianGui Xu, Shenzhen (CN); XiangYu Yi, Shenzhen (CN); HaoYuan Lin, Shenzhen (CN); XianFeng Jia, Shenzhen (CN)

(73) Assignee: Shenzhen Chenbei Technology Co., Ltd., Shenzhen (CN)

( * ) Notice: Subject to any disclaimer, the term of this patent is extended or adjusted under 35 U.S.C. 154(b) by 123 days.

(21) Appl. No.: 18/541,406

(22) Filed: Dec. 15, 2023

(65) Prior Publication Data
US 2024/0313519 A1 Sep. 19, 2024

(51) Int. Cl.
*H05K 5/02* (2006.01)
*H02G 15/10* (2006.01)
*H02G 15/18* (2006.01)

(52) U.S. Cl.
CPC ............. *H02G 15/18* (2013.01); *H02G 15/10* (2013.01); *H05K 5/0247* (2013.01)

(58) Field of Classification Search
CPC .................................................. H05K 5/0247
See application file for complete search history.

(56) References Cited

U.S. PATENT DOCUMENTS

2019/0261461 A1* 8/2019 Mcdonnell ............... H05B 3/08
2024/0313486 A1* 9/2024 Zuo ....................... H01H 85/143

FOREIGN PATENT DOCUMENTS

CN 109861031 B * 12/2021 ............. H05K 5/069

* cited by examiner

*Primary Examiner* — Hung V Ngo
(74) *Attorney, Agent, or Firm* — Trojan Law Offices

(57) ABSTRACT

The present application discloses a wire connection protection device of a cooking appliance and an air fryer. The wire connection protection device includes a rigid insulating sleeve sleeved over the connection between the internal wire and power wire of the cooking appliance, with both ends of the rigid insulating sleeve being sleeved over the outside of the outer sheath of the internal wire and the power wire, and a fire sleeve sleeved outside the rigid insulating sleeve. The rigid insulating sleeve improves the structural stability of the connection between the internal wire and the power wire such that it does not loosen easily. The fire sleeve prevents the connection from heating up and catching fire. The rigid insulating sleeve and the fire sleeve collectively insulate the heat source from the inside to prevent the fire from spreading, so as to improve the safety at the wire connection.

11 Claims, 7 Drawing Sheets

WIRE CONNECTION PROTECTION DEVICE

CROSS-REFERENCE TO RELATED APPLICATIONS

This application claims priority to and benefit of the earlier Chinese Patent Application No. CN202320566314.2 filed on Mar. 16, 2023, the content of which is incorporated herein by reference in its entirety.

TECHNICAL FIELD

The present application belongs to the technical field of cooking appliance manufacturing, particularly relating to a wire connection protection device of a cooking appliance such as an air fryer.

BACKGROUND

When connecting a power wire of a cooking appliance to the internal wire, the power wire is usually directly connected to the internal wire through closed-end connectors, copper strips, and the like. When the wires are secured and connected manually or mechanically, there can be an excessive gap between the wires or the wires could be loosely secured, resulting in excessive resistance at the connection between the power wire and the internal wire during the use of the cooking appliance. This could result in high circuit temperatures that could cause the cooking appliance to burn from the heat or even create flames.

BRIEF DESCRIPTION OF THE FIGURES

These and other features and advantages of the present disclosure will become appreciated, as the same becomes better understood with reference to the specification, claims and drawings herein.

SUMMARY OF THE INVENTION

Figure 1:
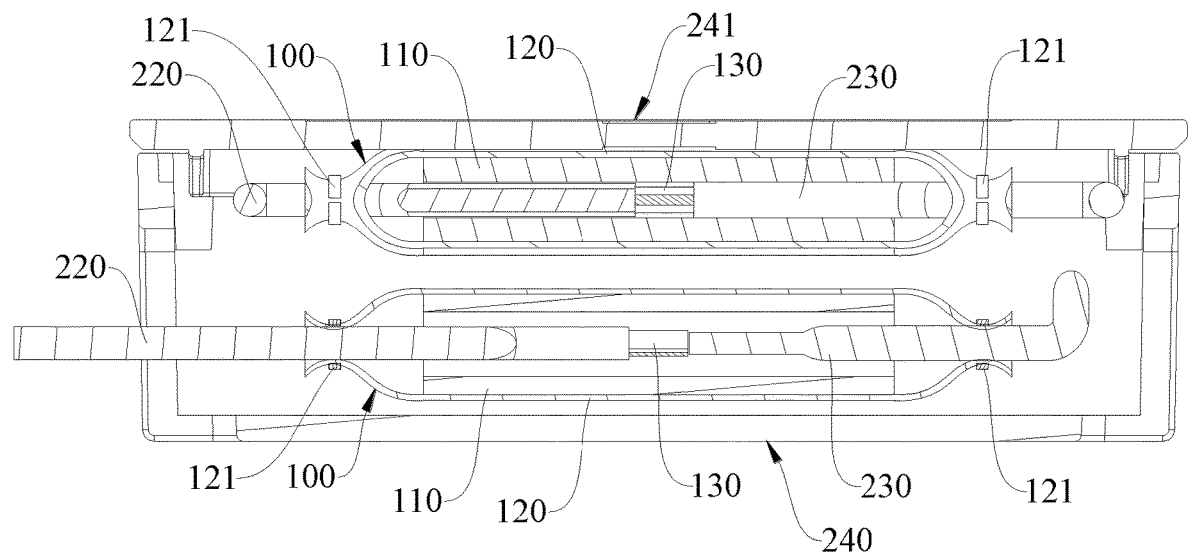
FIG. 1 is a structural schematic front cross-sectional view of a wire connection protection device and a junction box provided in an example of the present application.
Figure 2:
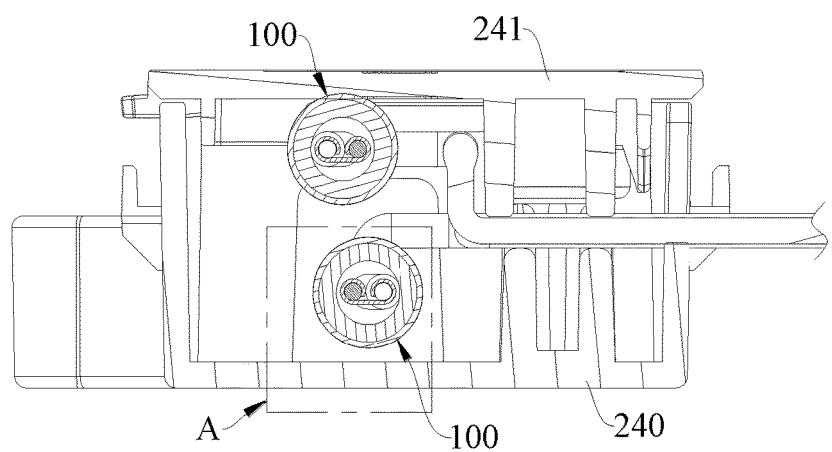
FIG. 2 is a structural schematic side cross-sectional view of a wire connection protection device and a junction box provided in an example of the present application.

The purpose of the present application is to address at least one of the existing technical problems in prior art. To this end, the present application proposes a wire connection protection device to improve the structural stability of the wire connection and to prevent potential fires caused by excessive circuit temperatures for a cooking appliance.

In a first aspect, the present application provides a wire connection protection device of a cooking appliance, including:

a rigid insulating sleeve, adapted to be sleeved over the connection between the internal wire and the power wire of the cooking appliance, with both ends of the rigid insulating sleeve sleeved over the outer sheath of the internal wire and the power wire;

a fire sleeve, sleeved over the rigid insulating sleeve.

According to the wire connection protection device of the present application, the rigid insulating sleeve improves the structural stability of the connection between the internal wire and the power wire such that the connection does not loosen easily. The fire sleeve prevents the connection from heating up and catching fire, and the rigid insulating sleeve and the fire sleeve collectively insulate the heat source from the inside to prevent any potential fire from spreading, so as to improve the safety at the wire connection.

According to an example of the present application, the ratio of the inner diameter of the rigid insulating sleeve to the outer diameter of the internal wire is $\alpha$, where $1<\alpha<2$; the ratio of the inner diameter of the rigid insulating sleeve to the outer diameter of the power wire is $\beta$, where $1<\beta<2$.

According to an example of the present application, the fire sleeve has at least two constricted positions, the rigid insulating sleeve being located between the at least two constricted positions, and the flow cross-sectional area between the constricted positions and the outside is smaller than the flow cross-sectional area in the middle portion of the fire sleeve.

According to an example of the present application, the wire connection protection device further includes:

at least two tightening members, surrounding the outside of the fire sleeve and disposed at the two constricted positions, the tightening members alter the size of the inner diameter of the constricted positions.

According to an example of the present application, the tightening members are disposed as strips, and the distance between the tightening members and the end of the fire sleeve is greater than 2 times the width of the tightening members.

According to another example of the present application, the embodiment includes a connector, for connecting the internal wire and the power wire.

According to an example of the present application, the rigid insulating sleeve is made of one of mica, ceramic, carbon fiber, and glass;

the fire sleeve is made of a fire-resistant material such as fiberglass.

In a second aspect, wire connection protection device the cooking appliance includes:

a casing;

an electronic device, disposed within the casing;

an internal wire, for connecting one end thereof to the electronic device;

a power wire, with one end thereof being connected to the other end of the internal wire, and the other end thereof being used to connect to an external power source;

the wire connection protection device according to any of the above, the wire connection protection device being disposed at the connection between the internal wire and the power wire.

According to the air fryer of the present application, the wire connection protection device is disposed at the connection between the internal wire and the power wire such that the connection between the internal wire and the power wire is first protected by the rigid insulating sleeve, improving the structural stability of the connection between the internal wire and the power wire such that it does not loosen easily, the fire sleeve is disposed outside the rigid insulating sleeve to further enhance fireproof effects and prevent the connection from heating up and potentially catching fire, and the rigid insulating sleeve and the fire sleeve collectively insulate the heat source from the inside to prevent the fire from spreading, so as the improve the safety at the wire connection and improve the safety and robustness of the air fryer.

According to an example of the present application, the cooking appliance further includes:
  a junction box, provided within the casing, with the wire connection protection device provided in the junction box.

According to an example of the present application, at least two wire connection protection devices are provided, and they are adapted to be installed at the connection between the live wire of the internal wire and the power wire and at the connection between the ground wire of the internal wire and the power wire.

Additional aspects and advantages of the present application will be provided in part in the following description, which will become apparent from the following description, or learned through practice of the present application.

DETAILED DESCRIPTION

Embodiments of the present application are described in detail below, examples of which are shown in the attached drawings, wherein the same or similar numerals throughout represent the same or similar elements or elements having the same or similar functions. The examples described below with reference to the attached drawings are exemplary, are for the purpose of interpreting the present application only, and should not be construed as limiting the present application.

A wire connection protection device 100 of a cooking appliance according to an example of the present application is described below with reference to FIGS. 1-5. Examples of the cooking appliance include an air fryer.

The wire connection protection device 100 includes a rigid insulating sleeve 110 and a fire sleeve 120.

The rigid insulating sleeve 110 is sleeved over the connection between the internal wire 220 and the power wire 230 of the cooking appliance 200, and both ends of the rigid insulating sleeve 110 are sleeved over the outer sheath of the internal wire 220 and the power wire 230.

In the present embodiment, both ends of the rigid insulating sleeve 110 are sleeved over the outer sheath of the internal wire 220 and the power wire 230 to protect the bare wires exposed for the connection of the internal wire 220 and the power wire 230. The insulating properties of the rigid insulating sleeve 110 prevent short circuits and the rigid structure protects the connection between the internal wire 220 and the power wire 230, ensuring the stability of the connection during installation and use such that it does not loosen easily, reducing the risk of the connection heating up and catching fire due to increased resistance.

It should be noted that the rigid insulating sleeve 110 may be disposed in forms such as a round tube or a square tube that are not limited herein.

In some examples, the wire connection protection device further includes a connector for connecting the internal wire and the power wire.

In the present embodiment, the connector is disposed in a variety of ways: For example, as shown in FIG. 1, the connector is a copper strip 130 that connects the internal wire 220 and the power wire 230, and the copper strip 130 has good conductivity and a relatively stable connection structure.

In another example, the connector is a fuse that is capable of connecting the bare wires of the internal wire 220 and the power wire 230, and the fuse serves to protect the circuit from fire when it blows out.

The fire sleeve 120 is sleeved over the rigid insulating sleeve 110. In the present embodiment, the fire sleeve 120 is then sleeved over the rigid insulating sleeve 110. Once an accident occurs that causes the connection in the rigid insulating tube to heat up and catch fire, the fire sleeve 120 acts as the second layer of protection, separating the internal heat and open flame from the cooking appliance 200, and insulating the heat and source of ignition inside with the rigid insulating sleeve 110 to prevent the fire from spreading and damaging other parts of the cooking appliance 200.

According to the wire connection protection device 100 provided by an example of the present application, a rigid insulating sleeve 110 improves the structural stability at the connection between the internal wire 220 and the power wire 230 such that it does not loosen easily, the wire connection protection device 100 acts as a barrier to insulate the flame and prevent it from burning outwards if the connection catches fire; a fire sleeve 120 is disposed to further compress the internal space at the connection between the internal wire 220 and the power wire 230, and is capable of reducing air circulation between external air and the connection, preventing the connection from heating up and catching fire. The rigid insulating sleeve 110 and the fire sleeve 120 collectively insulate the heat source from the inside to prevent the fire from spreading, so as the improve the safety at the wire connection.

Figure 5:
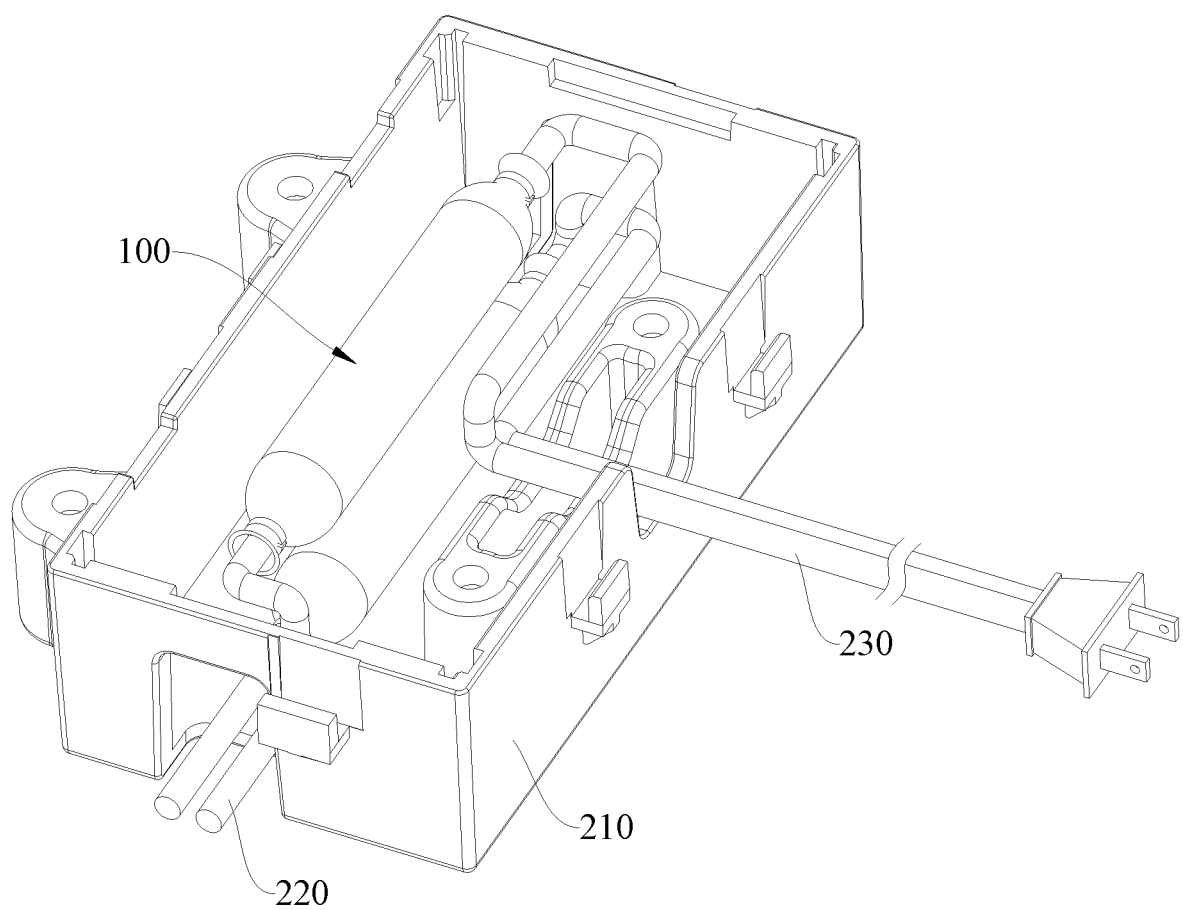
FIG. 5 is a partial structural schematic view of a junction box provided in an example of the present application.
Figure 6:
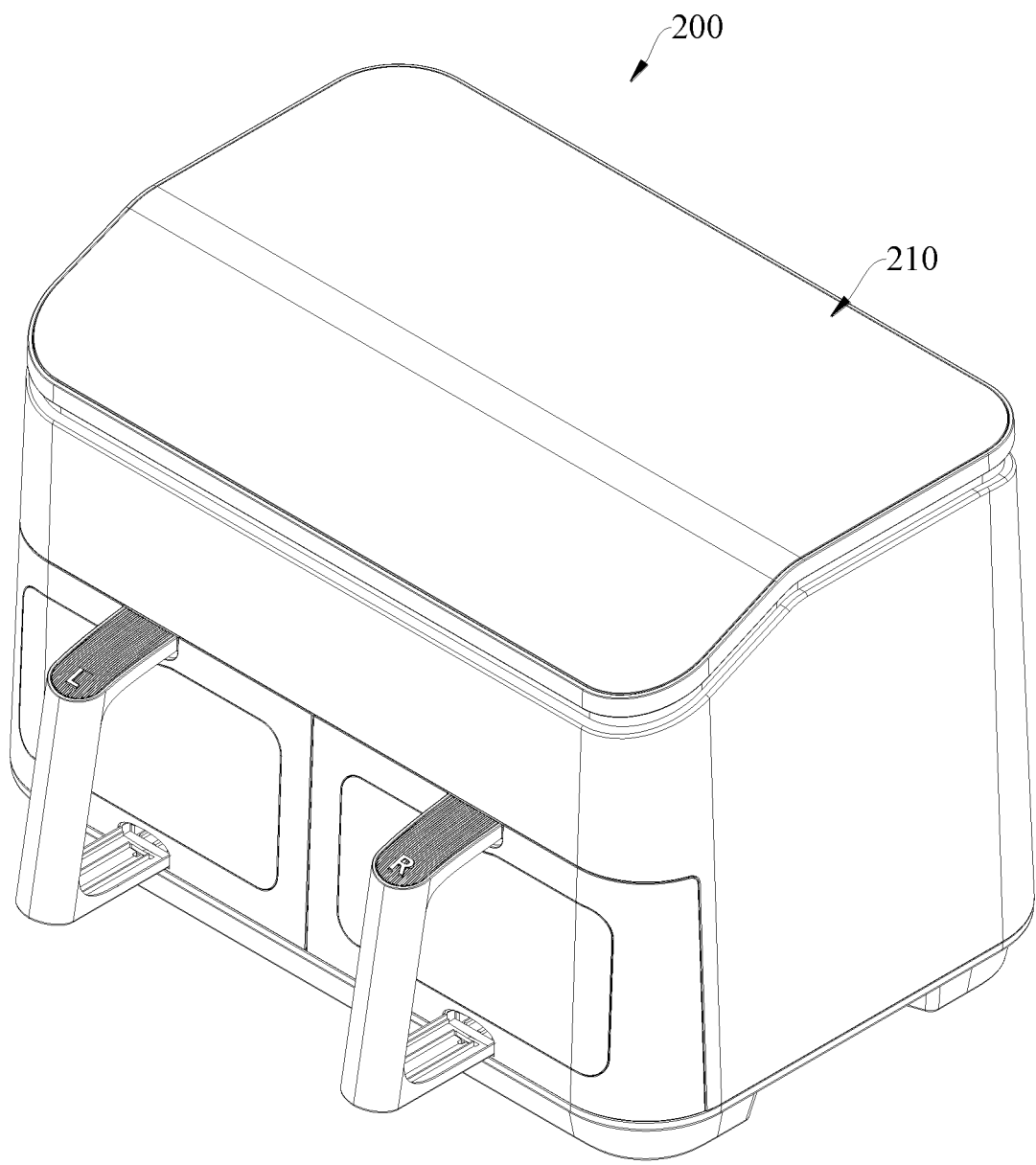
FIG. 6 is a structural schematic perspective view of an air fryer provided in an example of the present application.
Figure 7:
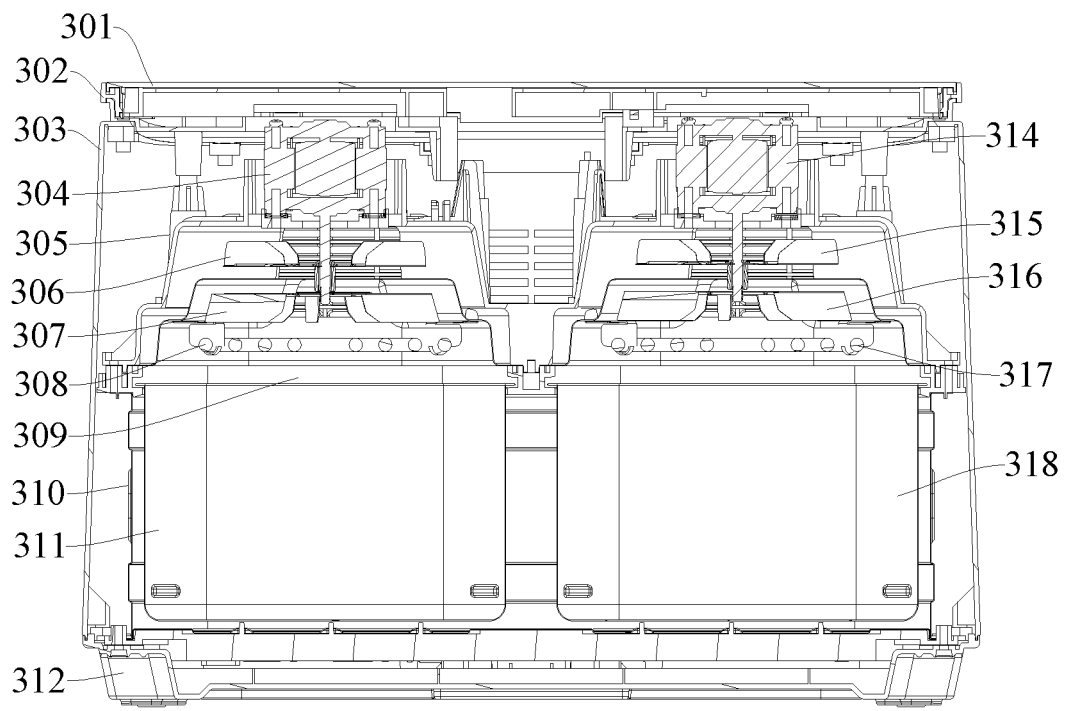
FIG. 7 is a structural schematic front cross-sectional view of an air fryer provided by an example of the present application.
Figure 8:
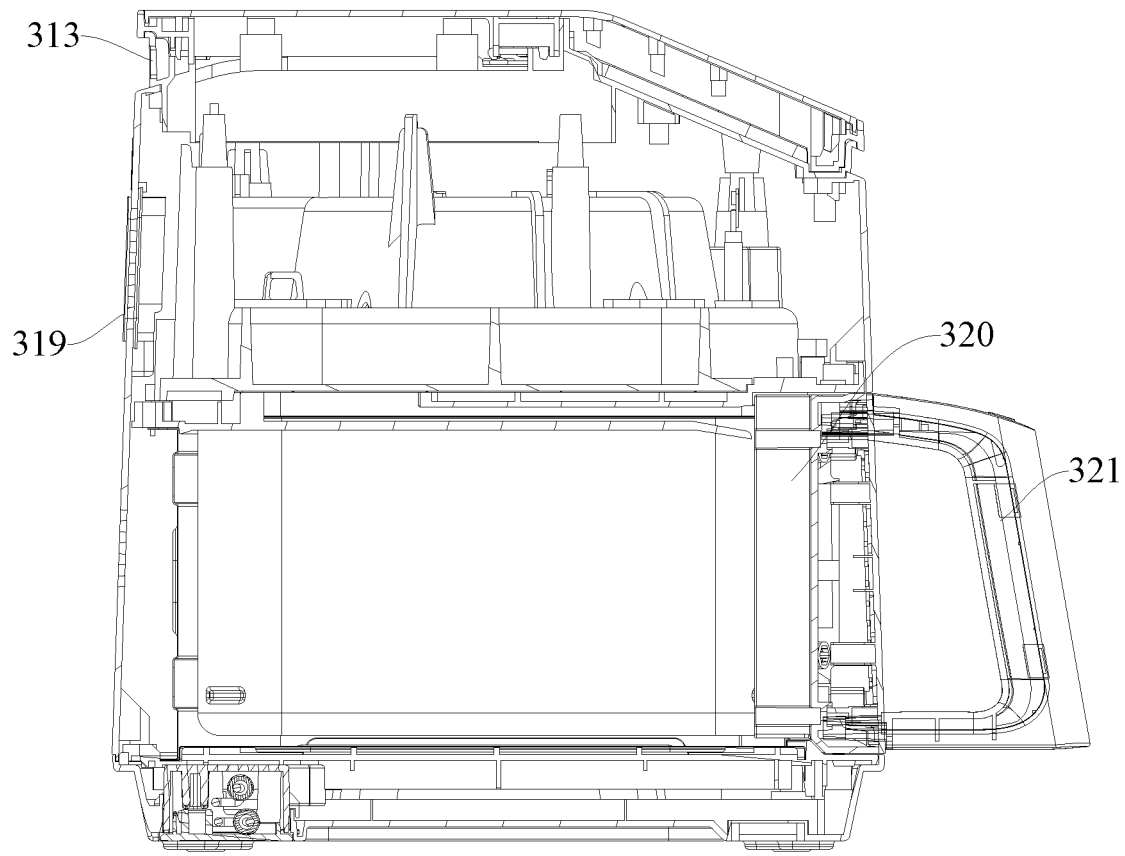
FIG. 8 is a structural schematic left cross-sectional view of an air fryer provided in an example of the present application.
Figure 9:
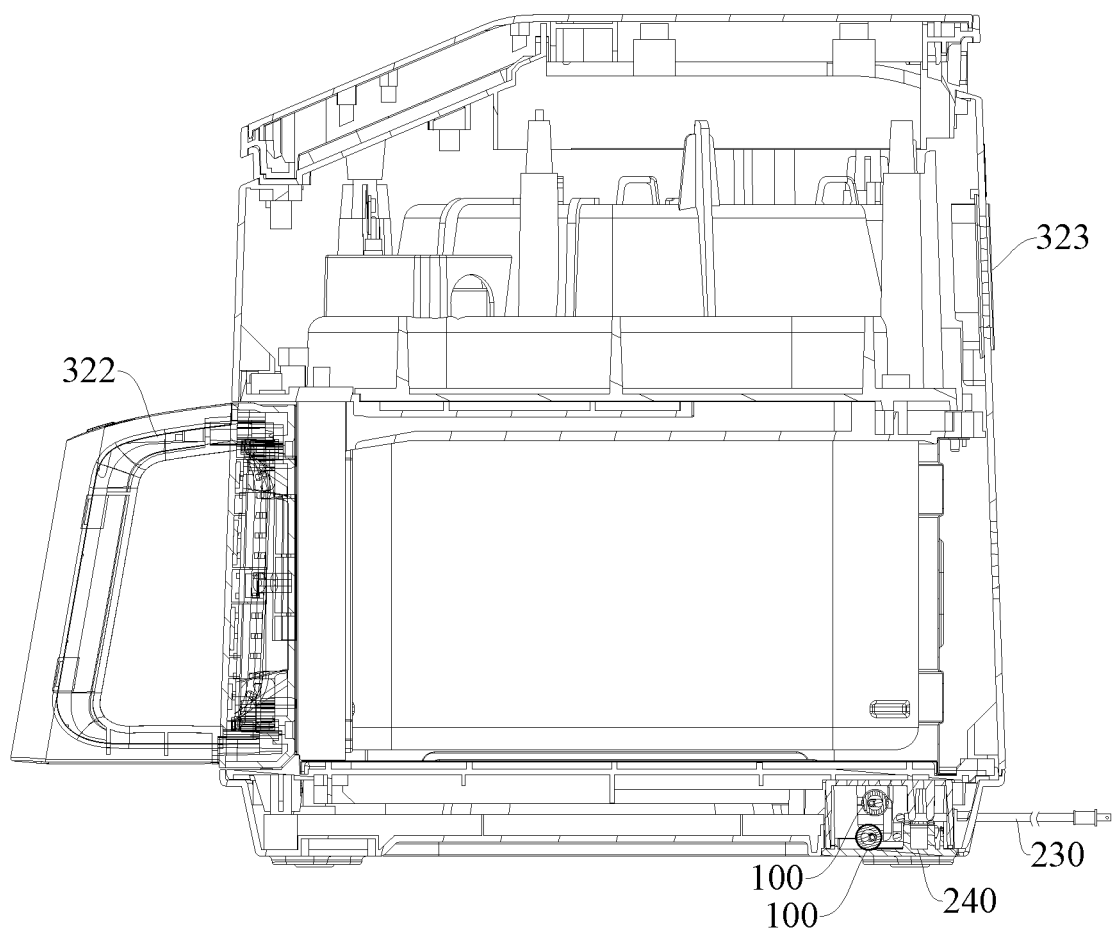
FIG. 9 is a structural schematic right cross-sectional view of an air fryer provided in an example of the present application.

As shown in FIG. 5, in some examples, the ratio of the inner diameter of the rigid insulating sleeve 110 to the outer diameter of the internal wire 220 is a, where $1<\alpha<2$.

The inner diameter of the rigid insulating sleeve 110 is disposed to be less than 2 times the outer diameter of the internal wire 220 to reduce radial shaking of the internal wire 220 within the rigid insulating sleeve 110, where $\alpha=1.8$ or $\alpha=1.5$.

The ratio of the inner diameter of the rigid insulating sleeve 110 to the outer diameter of the power wire 230 is $\beta$, where $1<\beta<2$.

The inner diameter of the rigid insulating sleeve 110 is disposed to be less than 2 times the outer diameter of the power wire 230 to reduce radial shaking of the power wire 230 within the rigid insulating sleeve 110, where $\beta=1.8$ or $\beta=1.5$.

It can be understood that, without affecting the wire connection, the closer the inner diameter of the rigid insulating sleeve 110 is to the size of the internal wire 220 and the power wire 230 the better, as it would minimize the movement of the wiring and reduce the risk of the wire connection loosening.

It should be noted that the outer diameter of the internal wire 220 and the power wire 230 refers to the outer diameter of the jacket of a single wire, that is, the outer diameter of the outer sheath of the neutral wire or live wire of the internal wire 220 and the power wire 230.

In the present embodiment, the rigid insulating sleeve 110 is disposed as a round tube. The specific dimensions of the rigid insulating sleeve 110 may be provided in a variety of forms, and disposed according to the actual situation of the outer diameter of the internal wire 220 and the power wire 230.

In a first example, when the internal wire 220 has the same outer diameter as the power wire 230:

the inner cross-sectional dimensions of the rigid insulating sleeve 110 are disposed to be the same, which is larger than the diameter of a single wire, but the largest inner diameter is greater than the sum of the diameter of the two wires to prevent the two wires from overlapping and interleaving due to movement, which affects the stability of the connection.

In a second example, when the outer diameter of the internal wire 220 is different from that of the power wire 230:

the inside of the rigid insulating sleeve is disposed in varying cross-sectional dimensions, the side near the internal wire 220 is disposed to correspond to the outer diameter of the internal wire 220, where $1<\alpha<2$; the side near the power wire 230 is disposed to correspond to the outer diameter of the power wire 230, where $1<\beta<2$, so as to prevent the smaller wires from shaking within the rigid insulating sleeve 110 due to the different dimensions of the internal wire 220 and the power wire 230.

Figure 3:
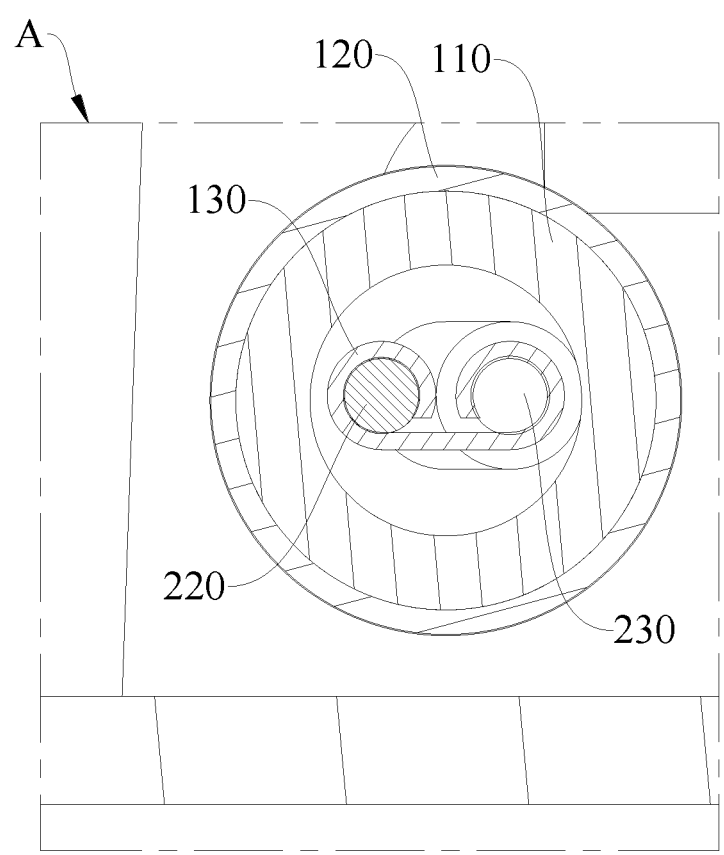
FIG. 3 is a partially enlarged schematic view at A in FIG. 2.

As shown in FIGS. 1 and 3, in some examples, the fire sleeve 120 has at least two constricted positions, the rigid insulating sleeve 110 being located therebetween.

The fire sleeve 120 at the constricted positions is contractible inwardly to reduce the gap between the fire sleeve 120 and the internal wire thereof, thereby reducing the air circulation at the constricted positions. By disposing two constricted positions, an insulated space may be formed between the two constricted positions to reduce the contact and circulation between the inside of the insulated space and the external air.

The rigid insulating sleeve 110 is located between the two constricted positions, so as to fully insulate the internal space of the rigid insulating sleeve 110 in the insulated space. Even if a short circuit causes an open flame, the fire will not spread further due to the lack of air circulation and lack of oxygen, which prevents combustion.

The present embodiment has at least two constricted positions, and the plurality of constricted positions may be in the form of at least one of the following structures:

first, two constricted positions are provided, and they are located on the outer side of the rigid insulating sleeve 110, arranged as close to the rigid insulating sleeve 110 as possible, and are capable of limiting the rigid insulating sleeve 110;

second, more than two constricted positions are provided, and the more than two constricted positions are evenly disposed on the outer side of the rigid insulating steel sleeve, so as to enhance the insulation effect by disposing more constricted positions, and when a plurality of constricted positions are disposed, the two constricted positions close to both ends of the rigid insulating sleeve 110 are disposed as close to the rigid insulating sleeve 110 as possible to limit them.

In the present embodiment, the flow cross-sectional area between the constricted position and the outside is smaller than the flow cross-sectional area in the middle portion of the fire sleeve 120.

The flow cross-sectional area between the constricted position and the outside is the gap cross-sectional area between the fire sleeve 120 and the internal wire thereof at the constricted position, the flow cross-sectional area in the middle portion of the fire sleeve 120 is the flow cross-sectional area at the rigid insulating sleeve 110, the middle portion of the fire sleeve 120 has a greater cross-sectional area to accommodate the rigid insulating sleeve 110, and the constricted position has a smaller flow cross-sectional area to effectively insulate air.

In some examples, the fire sleeve 120 is made of an elastic material, and the formation of the constricted position may be a deformation formed by the material itself during manufacturing.

It can be understood that the smaller the flow cross-sectional area between the constricted position and the outside, the better the insulation effect. The ratio of the flow cross-sectional area between the constricted position and the outside to the flow cross-sectional area in the middle portion of the fire sleeve 120 is $\theta$, where $\theta<1/5$, $\theta=1/10$, $\theta=1/15$, $\theta=1/20$, and the flow cross-sectional area between the constricted position and the outside should be 0 as much as possible.

According to the fire sleeve 120 provided in the present example, contact between the internal wire connection and external air is insulated through the thermal insulation and flame retardation properties of the fire sleeve 120 and the disposition of the constricted position. Even in the case of an open flame, the fire will not spread further. Hence, the fire sleeve is effective in insulation.

As shown in FIG. 1, in some examples, the wire connection protection device of the cooking appliance 200 further includes at least two tightening members 121, surrounding the outside of the fire sleeve 120 and disposed at the two corresponding constricted positions, the tightening members 121 being capable of disposing the size of the inner diameter of the constricted positions.

The size of the constricted positions may be controlled by disposing tightening members 121 on the outer side of the constricted positions. The tightening members 121 surround the outside the fire sleeve 120 such that the constricted position has no contraction blind spots during contraction.

In which, the constricted positions may be disposed in the form of at least one of the following structures:

first, the tightening members 121 are cable ties, and during installation, the cable ties are pulled tightly around the constricted position to achieve the contraction of the fire sleeve 120, which is simple to operate;

second, the tightening members 121 are metal bindings, and during installation, the metal bindings are pulled tightly around the constricted position and do not loosen due to the high heat resistance and strength of metal; it can be understood that there are no restrictions on the material of the metal bindings, and they may be iron, copper, and the like.

It can be understood that disposing the tightening members 121 may also secure the relative position of the fire sleeve 120 to the wiring to prevent the fire sleeve 120 from moving along the wiring, resulting in the fuse, the connection between the fuse and the internal wire 220, or the connection between the fuse and the power wire 230 from escaping from the scope of protection of the fire sleeve 120.

In some examples, the tightening members 121 are adapted to face the jacket portion of the power wire 230.

In the present embodiment, the jacket of the power wire 230 is the outermost protective skin of the power wire 230. The jacket of the power wire 230 is larger in diameter and stronger. The tightening members 121 are disposed at the jacket of the power wire 230, and the tightening members 121 are tightened on the jacket of the power wire 230 to secure it further. Moreover, due to the small contraction stroke, the fire sleeve 120 deforms to a small degree. Hence, it has a better fit and sealing effects.

It can be understood that if the internal wire 220 is also provided with a jacket, the tightening member 121 located on one side of the internal wire 220 is also correspondingly disposed at the jacket of the internal wire 220.

As shown in FIG. 1, in some examples, the tightening members 121 are disposed as strips.

The tightening strips are disposed to be strips, with a larger contact surface with the fire sleeve 120 during tightening, have better tightening effects and are less prone to wear and tear.

In the present embodiment, the distance between the tightening members 121 and the end of the fire sleeve 120 is greater than 2 times the width of the tightening members 121.

In the present embodiment, as the fire sleeve 120 is not made of a rigid material, the tightening members 121 are spaced a certain distance from the end of the fire sleeve 120 such that the contact between the tightening members 121 and the fire sleeve 120 is more secure, preventing the tightening members 121 from falling off the fire sleeve 120 when they are too close the end of the fire sleeve 120.

In actual use, the same effect may also be achieved by using a rod-like structure for the tightening members.

In some examples, the rigid insulating sleeve 110 may be made of one of mica, ceramic, carbon fiber, and glass.

It can be understood that other commonly used rigid insulating materials may also be used, and they will not be listed herein.

The fire sleeve 120 may be made of materials such as glass fiber. It should be noted that the specific materials of the fire sleeve 120 are not limited hereto.

According to the actual requirements, the fire sleeve may be made of the following materials, in ascending order of heat resistance: high temperature-resistant sleeve made of pure glass fiber, high temperature-resistant sleeve made of silicone glass fiber, basalt flame-retardant high temperature-resistant sleeve, and high silica fireproof and high temperature-resistant sleeve.

Embodiments of the present application also provide an cooking appliance 200, such as an air fryer.

As shown in FIGS. 6-9, the cooking appliance 200 includes a casing 210, an electronic device, an internal wire 220, a power wire 230, and the wire connection protection device 100 according to any of the examples above.

The electronic device is disposed within the casing 210, one end of the internal wire 220 is connected to the electronic device, one end of the power wire 230 is connected to the other end of the internal wire 220, and the other end of the power wire 230 is used to connect to an external power source.

The wire connection protection device 100 is disposed at the connection between the internal wire 220 and the power wire 230.

According to the cooking appliance 200 of the present application, a wire connection protection device 100 is disposed at the connection between the internal wire 220 and the power wire 230 such that the connection between the internal wire 220 and the power wire is protected by the rigid insulating sleeve 110, improving the structural stability of the connection between the internal wire 220 and the power wire 230 such that it does not loosen easily, the fire sleeve 120 is disposed outside of the rigid insulating sleeve 110 to further enhance fireproof effects and prevent the connection from heating up and catching fire, and the rigid insulating sleeve 110 and the fire sleeve 120 collectively insulate the heat source from the inside to prevent the fire from spreading, so as the improve the safety at the wire connection and improve the safety and robustness of the cooking appliance 200.

In some examples, the cooking appliance 200 also includes a junction box 240.

The junction box 240 is made of a fireproof material. Safety hazards are further reduced by disposing the power wire 230 protector to be made of a thermal-insulated fireproof material. The specific fireproof material is not limited herein and may be a commonly used fireproof plastic material on the market.

The junction box 240 is provided within the casing 210 and the wire connection protection device 100 is provided within the junction box 240.

The wire connection protection device 100 is disposed within the junction box 240 to enhance the protection of the wire connection protection device. The junction box 240 provides a third layer of protection for if the fire spreads.

In some examples, the junction box 240 is provided with a limiting structure, which may be a buckle or a column provided on the bottom wall of the junction box 240. The wire connection protection device is limited by the limiting structure to prevent the wire connection protection device from shaking within the junction box 240. In the present embodiment, at least two limiting structures are provided, and they limit the internal wire 220 and the power wire 230 on both sides of the wire connection protection device 100, respectively.

In some examples, the junction box 240 further includes a box cover 241, which is provided to cover the top of the junction box 240 and is disposed to be detachable. The box cover 241 is disassembled for easy installation during assembly, and forms a separate space when it covers the junction box 240 after assembly to improve the safety of the wire connection protection device 100.

Figure 4:
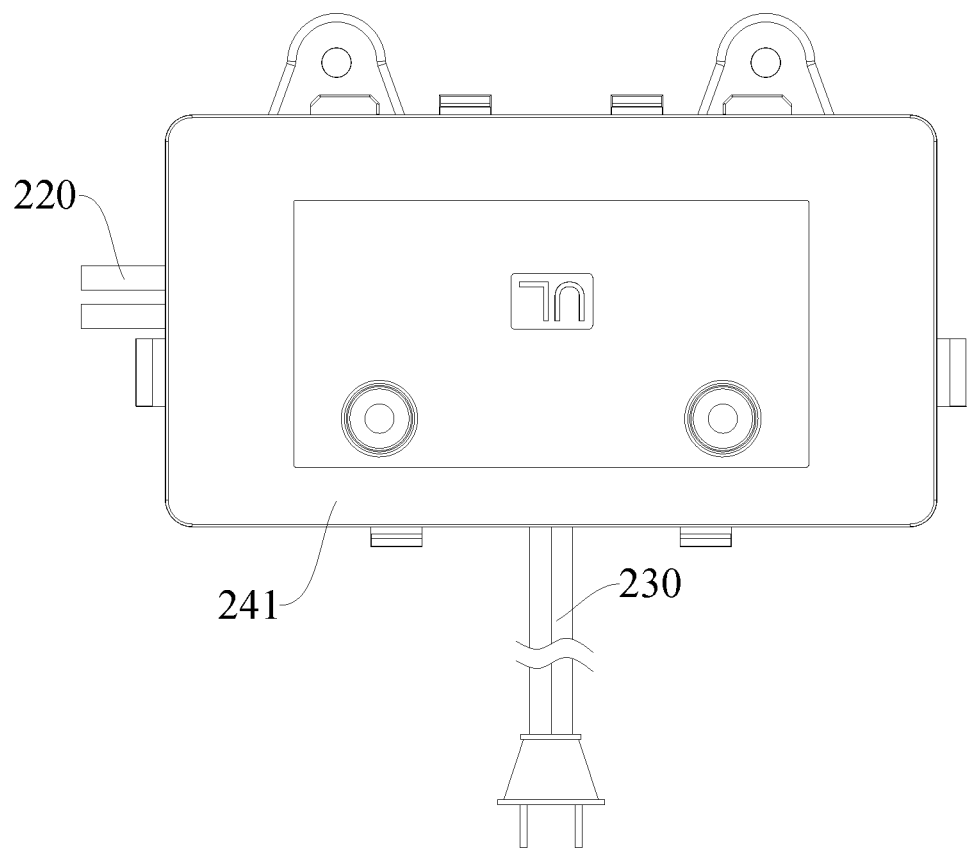
FIG. 4 is a structural schematic top view of a junction box provided in an example of the present application.

In some examples as shown in FIGS. 3-5, at least two wire connection protection devices 100 are provided, and they are adapted to be installed at the wire connection between the live wire of the internal wire 220 and the power wire 230 and at the wire connection between the neutral wire of the internal wire 220 and the power wire 230, respectively.

At least two rigid insulating sleeves 110 and fire sleeves 120 are provided, and they are adapted to be installed at the connection between the live wire of the internal wire 220 and the power wire 230 and at the connection between the neutral wire of the internal wire 220 and the power wire 230, respectively.

Generally, the cooking appliance 200 is provided with at least a neutral wire and a live wire, so at least two rigid insulating sleeves 110 and fire sleeves 120 are provided, respectively, to correspond to the respective electricity.

As shown in FIGS. 6-9, in some examples, the cooking appliance 200 includes a top cover 301, a trim ring 302, a machine body 303, a left motor 304, a motor frame 305, a left cooler blade 306, a left heater blade 307, a left heating tube 308, a guide rail 309, a rim 310, a left vat 311, a base 312, an air inlet 313, a right motor 314, a right cooler blade 315, a right heater blade 316, a right heating tube 317, a right vat 318, a right air outlet 319, a chamber column 320, a right handle 321, a left handle 322, a left air outlet 323, and a junction box 240.

The top cover 301 is connected to the trim ring 302 by buckles; the trim ring 302 is connected to the machine body 303 by screws; the air inlet 313 is disposed on the trim ring 302; the motor frame 305 is placed inside the machine body 303, above the guide rail 309, and is connected by screws; the left motor 304 and the right motor 314 are disposed on the left and right sides above the motor frame 305, and are connected by screws; the left and right air outlets 323, 319 are disposed on the left and right sides behind the machine body 303 and the motor frame 305, and are connected by buckles; the left and right cooler blades 306, 315 are placed below the left and right motors 304, 314 and are capable of high-speed rotation through the shaft connection; the left heater blade 307 is placed below the left cooler blade 306, the right heater blade 316 is placed below the right cooler blade 315, and are connected to the nut through the shaft, so as to achieve high-speed rotation; the left heating tube 308 is placed below the left heater blade 307, the right heating tube 317 is placed below the right heater blade 316, and are connected to the motor frame 305 by screws; the guide rail 309 is placed below the motor frame 305 and is connected by screws; the rim 310 is placed below the guide rail 309 and is connected by screws; the base 312 is placed below the rim 310 and the machine body 303 and is connected by screws, with the motor frame 305 and the rim 310 forming an inner chamber; the chamber column 320 is placed between the guide rail 309 and the base 312, is connected by screws, and divides the inner chamber into the left and right inner chambers; the left vat 311 is placed in the left chamber; the left handle 322 is placed on the outer side of the left vat 311, is connected by screws, and the left vat 311 is pulled out by pulling the left handle 322; the right vat 318 is placed in the right inner chamber; the right handle 321 is placed on the outer side of the right vat 318, is connected by screws, and the right vat 318 is pulled out by pulling the right handle 321; the junction box 240 is placed below the base 312, is connected by screws, and is capable of protecting the circuit.

The disposition of the junction box 240 is capable of reducing the activity space of the wire connection protection device during transportation and storage, reduce shaking and pulling of the internal wire and power wire. If there is poor contact between the power wire 230 and the contact end of the internal wire 220 during use, producing a flame and high temperatures, the junction box 240 is capable of preventing air from flowing through the power box, which results in high temperatures and fire, and effectively blows out the fuse and causes a power outage at the wire connection immediately when it reaches a high temperature, preventing a fire and combustion of the prototype.

The terms "first," "second," and the like in the Specification and Claims of the present application are used to distinguish similar objects and are not used to describe a particular order or sequence. It should be understood that the data used in this manner may be interchanged where appropriate such that the examples or implementations of the present application may be implemented in a sequence other than those illustrated or described herein, and that the objects distinguished by "first", "second", and the like are generally one type and do not define the number of objects, for example, the first object may be one or a plurality. Furthermore, "and/or" in the Specification and Claims refer to at least one of the connected objects, the character "/" and generally the pre- and post-associated object is an "or" relationship.

In the descriptions of the present application, it is to be understood that the orientational or positional relationships indicated by the terms "left," "right," "center," "length," "top," "bottom," "inner," "outer," "axial," "radial" and the like are based on the orientational or positional relationships shown in the drawings. They are merely for the purpose of describing the present application and simplifying the descriptions and are not intended to indicate or imply that the device or element referred to must have a particular orientation or be constructed and operated in a particular orientation, and thus cannot be construed as limitations of the present application.

In the description of the present application, a "first feature", a "second feature" may include one or a plurality of the features.

In the description of the present application, "plurality" means two or more.

In the description of the present application, the first feature "on" or "under" the second feature, can include direct contact between the first and second features, or further include indirect contact between the first and second features but through additional features therebetween.

In the description of the present application, the first feature "on," "above," and "upper," the second feature, includes the first feature directly above and obliquely above the second feature, or simply indicates that the level of the first feature is higher than that of the second feature.

Throughout the description of the present Specification, reference to the terms "an example," "some examples," "exemplary examples," "examples," "specific examples," "some examples," and the like, means that specific features, structures, materials, or characteristics described in connection with the example or implementation are included in at least one example or implementation of the present application. In the present Specification, schematic representations of the above terms are not necessarily meant to refer to the same example or implementation. Moreover, the specific features, structures, materials, or characteristics described may be combined in a suitable manner in any one or a plurality of examples or implementations.

Although examples of the present application have been shown and described, those with ordinary skill in the art may understand that: Various changes, modifications, substitutions and variations may be made to these examples without departing from the principles and purposes of the present application, the scope of which is defined by the Claims and their equivalents.

For ease of reference, the reference numbers in the figures are:
wire connection protection device 100, rigid insulating sleeve 110, fire sleeve 120, tightening member 121, copper strip 130;
cooking appliance 200, casing 210, internal wire 220, power wire 230, junction box 240, box cover 241;
top cover 301, trim ring 302, machine body 303, left motor 304, motor frame 305, left cooler blade 306, left heater blade 307, left heating tube 308, guide rail 309, rim 310, left vat 311, base 312, air inlet 313, right motor 314, right cooler blade 315, right heater blade 316, right heating tube 317, right vat 318, right air outlet 319, chamber column 320, right handle 321, left handle 322, left air outlet 323.

What is claimed is:

1. The wire connection protection device for a cooking appliance comprising:
a rigid insulating sleeve, adapted to be sleeved outside of a connection between an internal wire and a power wire of said cooking appliance;
wherein both ends of the rigid insulating sleeve are sleeved outside of an outer sheath of the internal wire and the power wire;
a fire sleeve that is sleeved over the rigid insulating sleeve; and,
at least two tightening members that surround the exterior of the fire sleeve in at least two constricted positions of the fire sleeve;

wherein the tightening members reduce the inner diameter of the fire sleeve at the at least two constricted positions.

2. The wire connection protection device according to claim 1, wherein the rigid insulating sleeve is located between the at least two constricted positions, and the cross-sectional area of middle portion of the fire sleeve between the constricted positions is smaller compared to the cross-sectional area of the at least two constricted positions when the tightening members are contracted.

3. The wire connection protection device according to claim 1, wherein the tightening members are strips, and the distance between the tightening members and the end of the fire sleeve is greater than 2 times the width of the tightening members.

4. The wire connection protection device according to claim 3, further comprising a connector that connects the internal wire and the power wire.

5. The wire connection protection device according to claim 3, wherein the rigid insulating sleeve is comprised of at least one of mica, ceramic, carbon fiber, or glass.

6. The wire connection protection device according to claim 3, wherein said cooking appliance has a casing.

7. The wire connection protection device according to claim 6, wherein the wire connection protection device is located within the casing at the connection between the internal wire and the power wire.

8. The wire connection protection device according to claim 7, further comprising a junction box wherein the wire connection protection device is in a junction box.

9. The wire connection protection device to claim 7, further comprising at least two wire connection protection devices that are adapted to be installed at the connection between a live wire of the internal wire and the power wire and at the connection between the ground wire of the internal wire and the power wire.

10. The wire connection protection device for a cooking appliance comprising:
   a casing;
   an electronic device, disposed within the casing;
   an internal wire, for connecting one end thereof to the electronic device;
   a power wire, with one end thereof being connected to the other end of the internal wire, and the other end thereof being used to connect to an external power source;
   a rigid insulating sleeve, adapted to be sleeved outside of the connection between an internal wire and a power wire of said cooking appliance;
   wherein both ends of the rigid insulating sleeve are sleeved outside of the outer sheath of the internal wire and the power wire;
   a fire sleeve that is sleeved over the rigid insulating sleeve;
   the wire connection protection device being disposed at the connection between the internal wire and the power wire; and,
   a junction box provided within the casing, with the wire connection protection device provided in the junction box.

11. The wire connection protection device according to claim 10, wherein at least two wire connection protection devices are provided, and they are adapted to be installed at the connection between the live wire of the internal wire and the power wire and at the connection between the ground wire of the internal wire and the power wire.

* * * * *